(12) United States Patent
Amey, Jr. et al.

(10) Patent No.: US 8,564,967 B2
(45) Date of Patent: Oct. 22, 2013

(54) DEVICE AND METHOD FOR REDUCING IMPEDANCE

(75) Inventors: Daniel Irwin Amey, Jr., Durham, NC (US); William J. Borland, Chapel Hill, NC (US)

(73) Assignee: CDA Processing Limited Liability Company, Wilmington, DE (US)

( * ) Notice: Subject to any disclaimer, the term of this patent is extended or adjusted under 35 U.S.C. 154(b) by 1571 days.

(21) Appl. No.: 11/949,329

(22) Filed: Dec. 3, 2007

(65) Prior Publication Data

US 2009/0140400 A1 Jun. 4, 2009

(51) Int. Cl.
*H05K 1/16* (2006.01)

(52) U.S. Cl.
USPC ............ 361/765; 361/763; 361/766; 361/795

(58) Field of Classification Search
USPC ........... 257/691–692, 700, 520; 361/765–766
See application file for complete search history.

(56) References Cited

U.S. PATENT DOCUMENTS

| | | |
|---|---|---|
| 5,161,086 A | 11/1992 | Howard et al. |
| 6,611,419 B1 | 8/2003 | Chakravorty |
| 6,724,638 B1 | 4/2004 | Inagaki et al. |
| 6,775,150 B1 | 8/2004 | Chakravorty et al. |
| 7,613,007 B2 | 11/2009 | Amey, Jr. et al. |
| 7,701,052 B2 | 4/2010 | Borland et al. |
| 2004/0012938 A1 | 1/2004 | Sylvester et al. |
| 2004/0209398 A1 | 10/2004 | Iljima et al. |
| 2006/0138591 A1 | 6/2006 | Amey et al. |
| 2006/0215380 A1* | 9/2006 | Lu et al. ..................... 361/763 |
| 2007/0263364 A1 | 11/2007 | Kawabe et al. |

FOREIGN PATENT DOCUMENTS

| | | |
|---|---|---|
| EP | 1137332 A1 | 9/2001 |
| EP | 1675447 A1 | 6/2006 |
| EP | 1777745 A2 | 4/2007 |
| JP | 2005191266 A | 7/2005 |
| WO | 0219430 A2 | 3/2002 |

OTHER PUBLICATIONS

U.S. Patent Application commonly owned by E. I. du Pont de Nemours and Company.
Aygun et al., Intel Technology Journal, vol. 9, Issue 4, published Nov. 9, 2005.
Borland, et al., "Decoupling of High Performance Semiconductors Using Embedded Capacitor Technology", Presented Oct. 2006 at CircuiTree Conference, Taiwan.
European Search Report dated Nov. 4, 2010, EP Application No. 08169295.

* cited by examiner

*Primary Examiner* — Tuan T Dinh

(57) ABSTRACT

A printed wiring board semiconductor package or PWB power core comprising singulated capacitors embedded on multiple layers of the printed wiring board semiconductor package wherein at least a part of each embedded capacitor lies within the die shadow and wherein the embedded, singulated capacitors comprise at least a first electrode and a second electrode. The first electrodes and second electrodes of the embedded singulated capacitors are interconnected to the Vcc (power) terminals and the Vss (ground) terminals respectively of a semiconductor device. The size of the embedded capacitors are varied to produce different self-resonant frequencies and their vertical placements within the PWB semiconductor package are used to control the inherent inductance of the capacitor-semiconductor electrical interconnections so that customized resonant frequencies of the embedded capacitors can be achieved with low impedance.

18 Claims, 15 Drawing Sheets

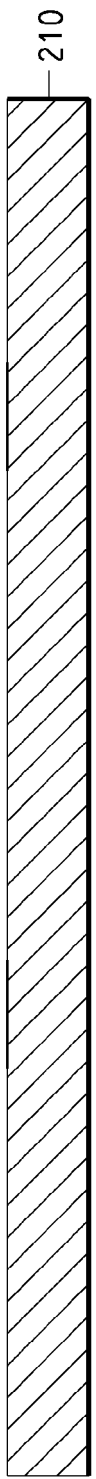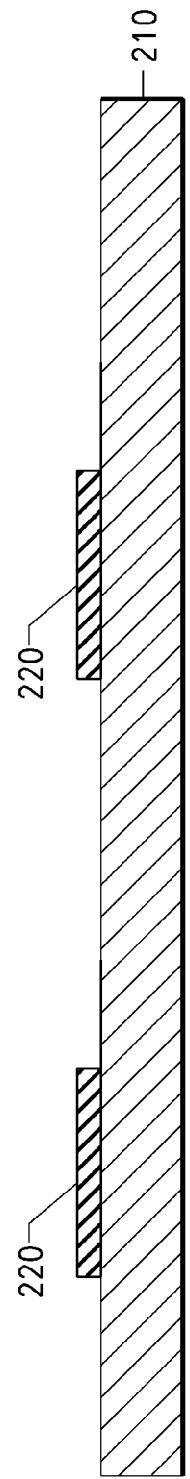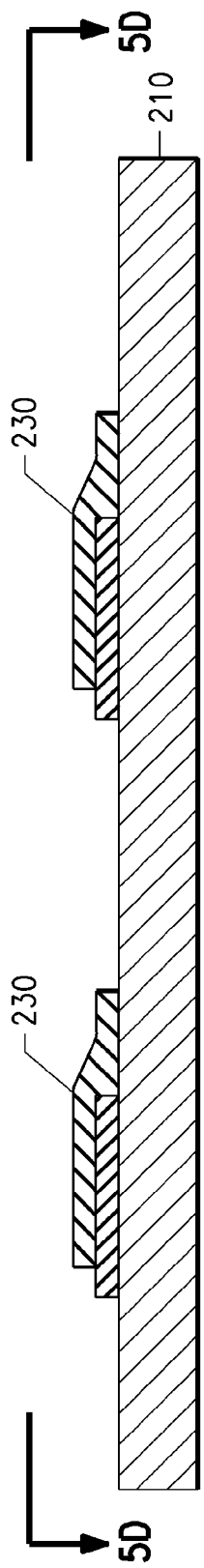

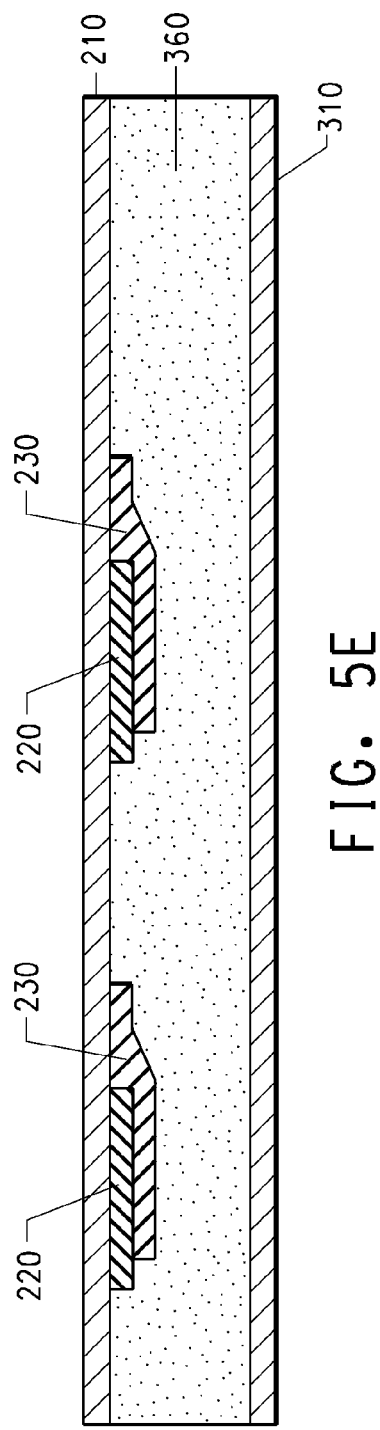
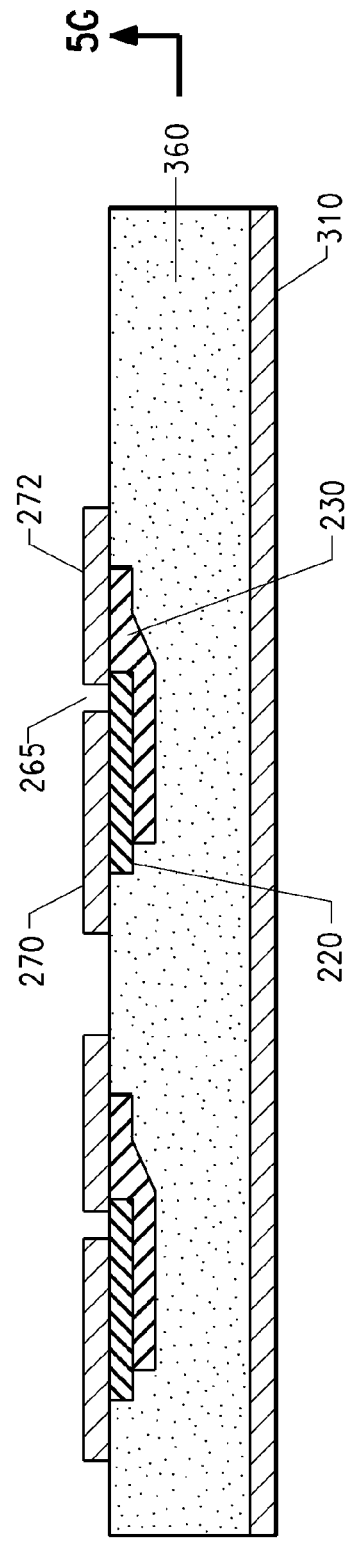

DEVICE AND METHOD FOR REDUCING IMPEDANCE

FIELD OF THE INVENTION

The technical field relates to methods of incorporating capacitors into printed wiring board (PWB) semiconductor packages such that the incorporated capacitors yield low impedance over that frequency range not served by surface mount capacitors or capacitors integrated into a semiconductor and also relates to such packages.

BACKGROUND OF THE INVENTION

Semiconductors that include integrated circuits (IC) operate at increasingly higher frequencies and data rates and at lower voltages. In turn, increasingly higher semiconductor operating frequencies (higher IC switching speeds) require that voltage response times to the IC must be faster. Lower operating voltages require that allowable voltage variations (ripple) and noise become smaller.

For example, a semiconductor, such as a microprocessor IC, switches and begins an operation, it calls for power to support the switching circuits. If the response time of the voltage supply is too slow, the microprocessor will experience a voltage drop or voltage droop that will exceed the allowable ripple voltage and reduce the circuit noise margin and the IC will malfunction. Additionally, as the IC powers up, a slow response time will result in voltage overshoot. Voltage droop and overshoot must be controlled within allowable limits by the use of capacitors that are close enough to the IC to provide or absorb power within the appropriate response time.

Ultimately, then, the reduction of noise in the power and ground (return) lines and the need to supply sufficient current to accommodate faster circuit switching become increasingly important. In order to provide low noise and stable power to the IC, low impedance in the power distribution system is required. In conventional printed wiring board (PWB) semiconductor packages, impedance is reduced by the use of surface mount capacitors.

A capacitor reduces impedance in the circuit across a relatively small frequency range around its resonant frequency. Therefore, many capacitors are chosen with different resonant frequencies to accomplish reduced impedance across a wide frequency range. The resonant frequency of a capacitor is dependent on its type, size, termination separation and the circuit resistance and inductance of its electrical interconnection to the semiconductor. The degree of impedance reduction at its resonant frequency is also proportional to the amount of capacitance so capacitors are typically interconnected in parallel to maximize total capacitance.

FIG. 1 is an electrical schematic for a typical placement of capacitors. Shown is a power supply, an IC and the capacitors 4, 6, 8, which represent high value, mid-range value and small value capacitors, respectively, used for impedance reduction and minimizing voltage droop and dampening voltage overshoot. In this electrical schematic, the total number of capacitors shown is 6 capacitors. In practice however, this total may reach several hundred.

Conventional designs for capacitor placement mount capacitors on the surface of a printed wiring board (PWB) clustered around the IC. To maximize the frequency range over which impedance is reduced, large value capacitors are placed near the power supply, mid-range value capacitors at locations between the IC and the power supply, and small value capacitors very near the IC. A large number of capacitors, interconnected in parallel, is often needed to reduce power system impedance over a wide frequency range to target levels. This distribution of capacitors is also designed to reduce response time as power moves from the power supply to the IC.

FIG. 2 is a section view of a conventional design for providing power and reducing impedance by the use of surface mount capacitors and shows the connections of Surface Mount Technology (SMT) capacitors 50 and 60 and IC device 40 to the power and ground planes in the substrate of the PWB. IC device 40 is connected to lands 41 by solder filets 44. Lands 41 are connected to plated-through hole via pads 82 and 83 of vias 90 and 100 by circuit lines 72 and 73. Via 90 is electrically connected to conductor plane 120 and via 100 is connected to conductor plane 122. Conductor planes 120 and 122 are connected one to the power or voltage side of the power supply and the other to the ground or return side of the power supply. Small value capacitors 50 and 60 are similarly electrically connected to vias and conductor planes 120 and 122 in such a way that they are electrically connected to IC device 40 in parallel.

FIG. 3 is a section view of another conventional surface mount capacitor placement design for a method of providing power and reducing impedance wherein the surface mount technology (SMT) capacitors 150 and 160 are placed on the backside (package surface opposite to that of the semiconductor) of the printed wiring board semiconductor package. The PWB semiconductor package comprises a core 170 with through hole vias 175. Build-up layers 180 are formed on each side of the core and microvias 190 connect the through hole vias 175 of the core to the surface pads 195 of the build-up layers. The power (Vcc) and ground (Vss) terminals of the semiconductor 140 are connected to the terminals of the surface mount capacitors on the back side of the PWB semiconductor package through the microvias 190 and through hole vias 175.

Similar to the surface mount capacitor placement design shown in FIG. 3, FIG. 4A depicts an Intel Pentium 4® PWB semiconductor package and shows the placement of SMT capacitors on the central area of the backside of the package. FIGS. 4A and 4B are adapted from Intel Technology Journal, Volume 9, Issue 4, 2005.

FIG. 4B shows the impedance of such an Intel Pentium 4® PWB semiconductor package. The vertical axis in FIG. 4B shows normalized magnitude of the impedance of the package and the horizontal axis shows frequency. Standard surface mount capacitors on the backside of the package (dark line in FIG. 4B) can effectively reduce impedance up to a little less than 100 megahertz (MHz). Use of low impedance array capacitors can raise this value to approximately 100 MHz due to their higher self resonant frequency. However, above 100 MHz, interconnection inductance of the capacitor circuitry begins to dominate and as can be seen from FIG. 4B, impedance rises. This interconnection inductance is due to vias extending through the thickness of the package to interconnect the capacitors to the microprocessor. Such vias are depicted by vias 175 in FIG. 3. At approximately 1 gigahertz (GHz), capacitors integrated in the semiconductor device (on-chip capacitors) reduce impedance back to lower values. Thus, the inability to effectively reduce impedance in this mid-frequency range remains a major problem to be solved.

General approaches for minimizing impedance and "noise" are known, such as that described in U.S. Pat. No. 5,161,086 to Howard et al. Howard et al. discloses a capacitive printed circuit board with one or more capacitor laminate (planar capacitor) placed within the multiple layers of the laminated printed wiring board. A large number of integrated circuits, are mounted on the board and operatively coupled with the capacitor laminate(s). The board provides capacitive function using borrowed or shared capacitance with low interconnection inductance. This approach however, does not achieve high capacitance in small PWB packages due to the low dielectric constant of the organic laminate and does not reduce impedance in the desired frequency range. Simply placing the organic capacitor laminate closer to the IC is not a satisfactory technical solution because the total available capacitance in a small PWB semiconductor package is insufficient and the capacitor laminate resonant frequency is not in the desired range.

U.S. Pat. No. 6,611,419 to Chakravorty discloses an alternate approach to embedding capacitors in order to reduce switching noise. The power supply terminals of an integrated circuit die can be coupled to the respective terminals of at least one embedded capacitor in a multilayer ceramic substrate.

U.S. Pat. App. Pub. No. 2006-0138591 to Amey et al. discloses methods for incorporating high capacitance capacitors into the core of a printing wiring board to reduce interconnection inductance and suggests that these may be placed in the build-up layers for minimized impedance. Ser. No. 11/732,174 to Borland et al. discloses a design in which capacitors are embedded in the outer layers of a printed wiring board.

Borland et al. in "Decoupling of High Performance Semiconductors Using Embedded Capacitors", CircuiTree Live, Taiwan, October, 2006 show electrical simulation data in which an array of 200 embedded capacitors placed in the "x-y" plane of the printed wiring board within the area beneath the semiconductor (die shadow) reduced impedance to ITRS 2007 target values in the mid-frequency range between approximately 300 MHz and 1 GHz. Embedding the capacitors shifts the resonant frequencies of the capacitors to higher values as compared to surface mount capacitors due to the low inductance of the electrical interconnections of the capacitors to the semiconductor. To be effective, decoupling using embedded capacitors requires many capacitors on the layer of the printed wiring board immediately beneath the semiconductor and within the die shadow.

Generally, these previous approaches of embedding ceramic capacitors have focused on placing the capacitors on a single layer of the PWB semiconductor package as close as possible to the semiconductor. These placement approaches intend to minimize the capacitor-semiconductor electrical interconnect distance so that inductance is reduced to a minimum thereby raising resonant frequencies of the embedded capacitors as high as possible for a given size. Achieving a range of resonant frequencies is then accomplished by use of differing sized embedded capacitors.

However, reducing impedance values of semiconductor PWB packages is still needed to further semiconductor advances. Reducing the overall impedance value of a semiconductor PWB package demands the reduction of impedance at the resonant frequency of each capacitor. Since the level of impedance reduction at the capacitor resonant frequency is proportional to its capacitance, further impedance reduction requires increasing the capacitance. Assuming that the capacitance density (that is, the capacitance per unit area) of each embedded capacitor does not improve, reducing impedance means that more capacitors must be placed on one layer within the die shadow. In order to accommodate the entire range of resonant frequencies desired, the previous approaches to embedded capacitor placement would merely place more and more capacitors of differing sizes on one layer within the die shadow.

However, since the area of the PWB semiconductor package directly within the die shadow is limited, there may not be sufficient area to place enough capacitors on one layer to achieve target impedance values over the desired frequency range. What is needed is a new approach to placing capacitors within a PWB semiconductor package. This new approach would result in capacitor placement that yields sufficiently high capacitance for the likely higher impedance values of future semiconductors. This new approach would also allow the customizing (or tailoring) of the resonant frequency of the embedded capacitors to specific frequency ranges so that impedance over a targeted frequency range, such as the frequency range exhibiting the impedance peaks in FIG. 4B, namely about 100 MHz to 1 GHz, is reduced to target values.

Such an approach is not predictable by the previously discussed approaches because they do not consider, motivate or suggest a multifactor mechanism of varying the vertical placement of the embedded capacitors while positioning at least a part of the capacitor horizontally within the die shadow while simultaneously controlling the distance of the capacitor electrode terminals from the semiconductor terminals.

The methods and devices described herein provide such an unanticipated approach and solve the problem of providing a sufficient number of capacitors positioned in such a way that their resonant frequencies achieve target values, when added together reduces impedance over the desired range of frequencies of between 100 MHz and 1 to 3 GHz so that the impedance spikes shown in FIG. 4B, for example, can be eliminated.

SUMMARY

Described herein are methods of making a printed wiring board semiconductor package or PWB power core comprising singulated capacitors embedded on multiple layers of the printed wiring board semiconductor package, at least a part of each embedded capacitor lying within the die shadow and wherein the embedded, singulated capacitors comprise at least a first electrode and a second electrode. The first electrodes and second electrodes of the embedded singulated capacitors are interconnected to the Vcc (power) terminals and the Vss (ground) terminals, respectively, of a semiconductor device. The size of the embedded capacitors are varied to produce different self-resonant frequencies and the vertical placements of the embedded capacitors within the PWB semiconductor package are used to control the inherent inductance of the capacitor-semiconductor electrical interconnections so that customized resonant frequencies of the embedded capacitors can be achieved with low impedance.

BRIEF DESCRIPTION OF THE DRAWINGS

The detailed description will refer to the following drawings, wherein like numerals refer to like elements, and wherein the drawings are not necessarily drawn to scale and wherein:

FIGS. 5A-5H illustrate a method of making a finished PWB semiconductor package wherein singulated capacitors are on multiple layers.

DETAILED DESCRIPTION

Definitions

Figure 1:
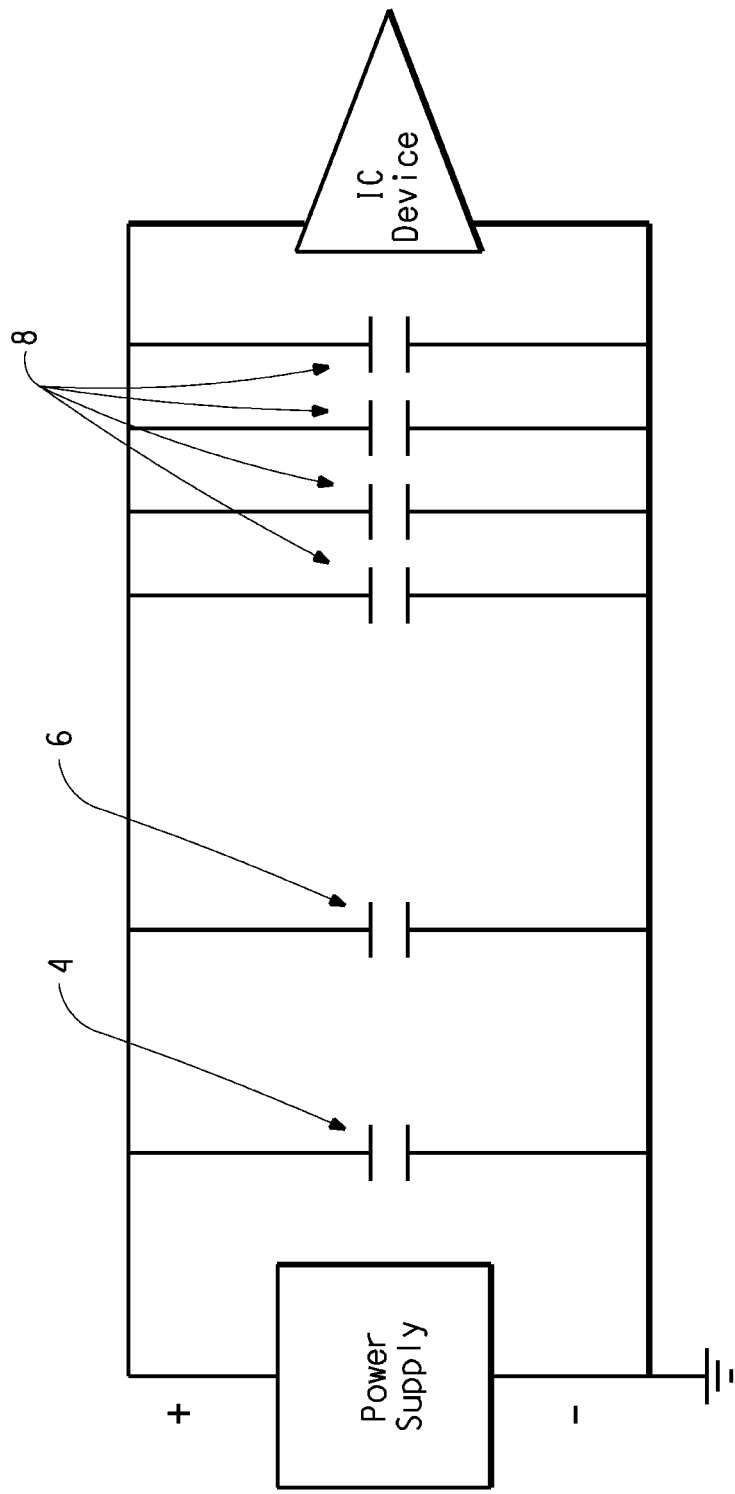
FIG. 1 is a schematic illustration of typical, prior art use of capacitors for impedance reduction and reducing voltage droop or dampening voltage overshoot.
Figure 2:
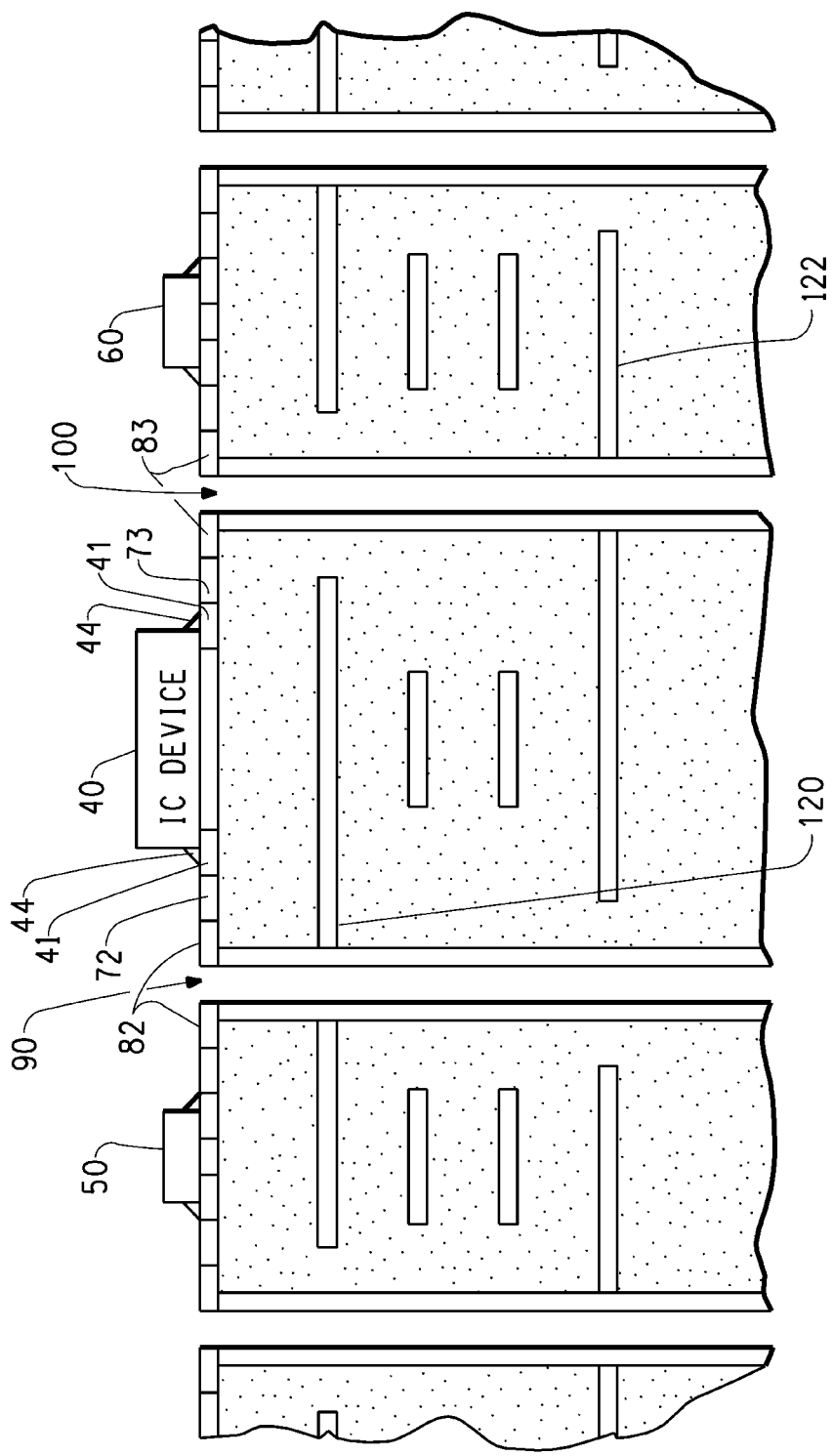
FIG. 2 is a representation in section view of a printed wiring board package having conventional, prior art surface mount (SMT) capacitors used for impedance reduction and reducing voltage droop or dampening voltage overshoot.
Figure 3:
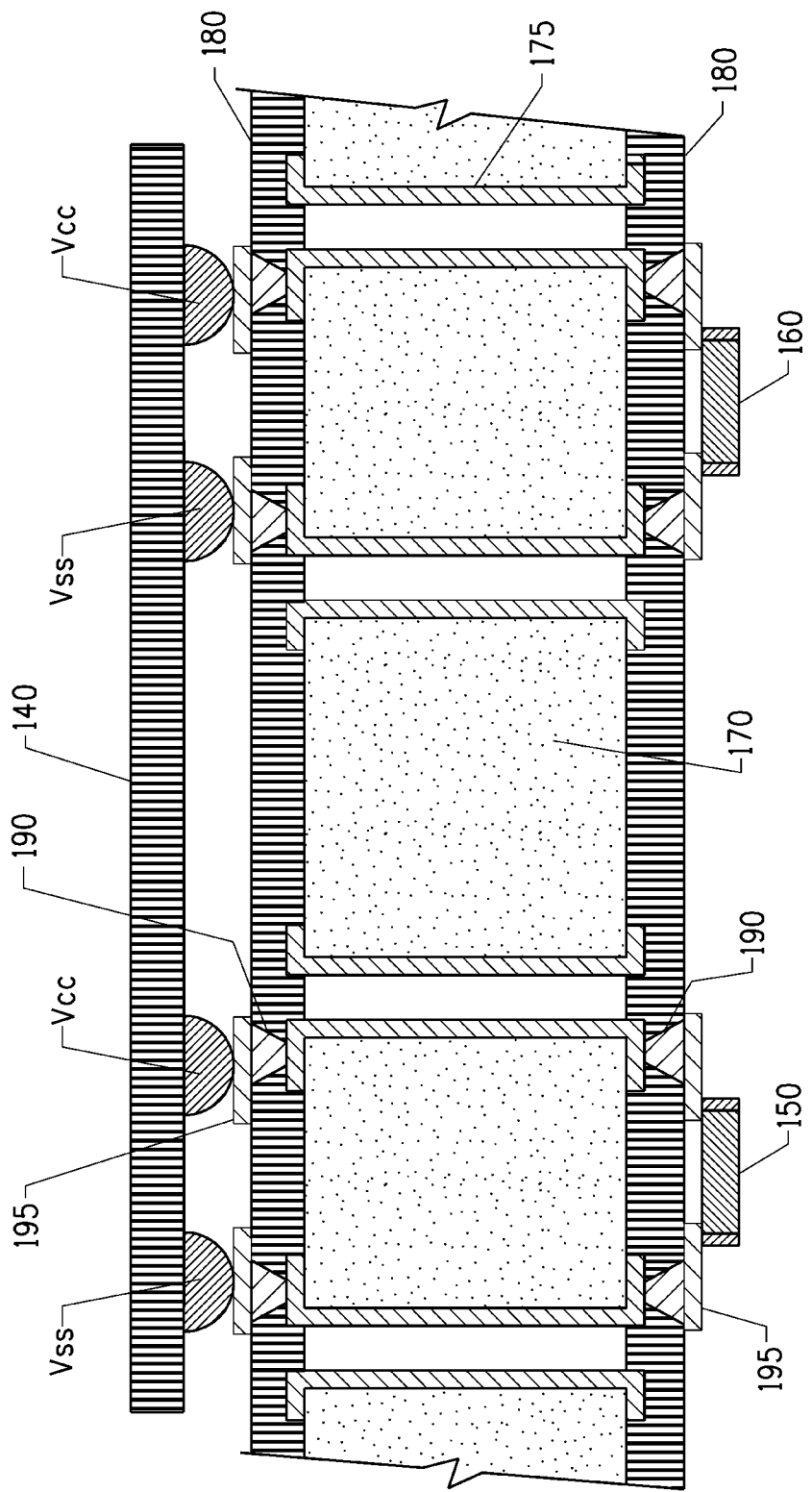
FIG. 3 is a representation in section view of a prior art printed wiring board semiconductor package in which the Surface Mount Technology (SMT) capacitors are placed on the backside of the printed wiring board semiconductor package to reduce impedance and reduce voltage droop or dampening voltage overshoot.

The description and claims herein shall be interpreted by reference to the following definitions:

As used herein, the term "die shadow" refers to the area that is projected onto the PWB semiconductor package from the semiconductor, as viewed from a top plan perspective.

As used herein, "fired-on-foil capacitors" refers to capacitors that are formed by firing a deposited dielectric layer on a metallic foil at an elevated temperature to crystallize and sinter the dielectric to form a high dielectric constant layer. A top electrode may be deposited before or after firing the dielectric to form the capacitor.

As used herein, "singulated capacitors" refers to individual capacitors formed on metal foil.

As used herein, the term "foil" encompasses a general metal layer, plated metal, sputtered metal, etc.

As used herein, the terms "high dielectric constant materials" or "high K, capacitor dielectric materials" refer to materials that have a bulk dielectric constant above 500 and can comprise perovskite-type ferroelectric compositions with the general formula $ABO_3$. Examples of such compositions include $BaTiO_3$; $BaSrTiO_3$; $PbTiO_3$; $PbTiZrO_3$; $BaZrO_3$ and $SrZrO_3$ or mixtures thereof. Other compositions are also possible by substitution of alternative elements into the A and/or B position, such as $Pb(Mg_{1/3}Nb_{2/3})O_3$ and $Pb(Zn_{1/3}Nb_{2/3})O_3$. Mixed metal versions of the above compositions are also included.

As used herein, an "inner layer panel" refers to a metal foil/prepreg layer that contains singulated embedded capacitors.

As used herein, the term "PWB semiconductor package", refers to a printed wiring board structure upon which at least one IC is placed and interconnected to and may otherwise be defined as a interposer, a multichip module, an area array package, a system-on package, a system-in-package, or the like.

As used herein, the terms "printed wiring board (PWB) core" or "printed wiring board (PWB) power core" refer to a printed wiring board structure formed from at least one inner layer PWB laminate structure that comprises at least one prepreg/metal layer that may contain circuitry and in the case of the PWB power core, embedded capacitors. A PWB core or PWB power core is typically used as the base for additional metal/dielectric layers that are built up or sequentially added to the core to form a finished semiconductor package.

As used herein, the term "printed wiring motherboard" refers to a large printed wiring board that the semiconductor package as defined above, is generally placed on and interconnected to.

As used herein, "capacitor self resonant frequency" refers to the resonant frequency of a singulated capacitor without any circuit interconnections.

As used herein, "capacitor resonant frequency" refers to the resonant frequency of the capacitor in its location within the PWB semiconductor package and includes the semiconductor-capacitor interconnect inductance and resistance. The capacitor resonant frequency will always be lower than its self resonant frequency due to the interconnect inductance and resistance.

As used herein, the terms "semiconductor" and "integrated circuit" or "IC" are interchangeable and refer to a device such as a microprocessor.

As used herein, the term "part of a capacitor" refers to something less than the whole capacitor to which it belongs. "Part" is a general term capable of replacing any other term that identifies one or more units of which a capacitor is composed and is interchangeable with "portion", "division", "subdivision", "segment", "section", and "fragment".

As used herein, the term "customized" refers to a quality of the resonant frequencies of capacitors embedded by the methods described herein. A "customized" resonant frequency refers to the resonant frequency that has been obtained, altered, or achieved according to individual specifications and/or made to match or suit individual needs. As a general term, "customized" is interchangeable with "tailored".

As used herein, "termination separation" refers to the distance between the terminals of (or sites of electrical connections to) the positive and negative electrodes of a capacitor.

Described herein is an approach for designing a PWB semiconductor package in which singulated capacitors may be embedded on different vertical layers of the package, at least a part of each capacitor lying within the die shadow. The size of the embedded capacitors may be varied to produce different capacitor self-resonant frequencies. Their vertical placements on the different layers of the PWB semiconductor package are used to control the inherent inductance of the embedded capacitor-semiconductor electrical interconnections so that each embedded capacitor provides reduced impedance at a customized resonant frequency. Multiple sizes and positions may be used to provide higher capacitance and thus, low impedance over the frequency range of 100 MHz to 1 to 3 GHz.

Further described herein is a method for placing singulated embedded capacitors at specific positions within a PWB semiconductor package such that each embedded capacitor provides reduced impedance at a targeted frequency, such as a precise value between 100 MHz and 1 to 3 GHz. Using varying sizes of capacitors and embedding them at differing vertical positions from the semiconductor allows a greater number of capacitors and hence more capacitance and correspondingly lower impedance over the entire desired frequency range. At its simplest, the described method is to place singulated capacitors of differing sizes at a certain vertical and horizontal position within the PWB semiconductor package to control their interconnect inductance. As for horizontal position, at least a part of each capacitor lies within the die shadow. As for vertical position, embedded singulated capacitors may be positioned on different layers within the PWB semiconductor package.

Placing the embedded, singulated capacitors so that at least a part of each capacitor lies within the die shadow of the semiconductor has the following effects. First, it eliminates inductance issues associated with conventional horizontal electrical traces (or fan-outs) required to interconnect IC terminals with the capacitor electrodes. As long as the capacitor electrode terminals (or sites of where electrical connections are made to the capacitor electrodes) of the embedded capacitor are placed at a distance outside the die shadow of less than the thickness of the PWB semiconductor package, the resonant frequency of the embedded capacitor will be higher than that achievable with surface mount capacitors on the backside of the package and the embedded capacitor will have a useful resonant frequency.

Second, placing the embedded, singulated capacitors according to the described method allows the inductance and the resistance values of the various interconnections to be controlled, which in turn gives the embedded capacitors and their electrical interconnects the capability to have targeted resonant frequencies.

Third, embedding singulated capacitors at different layers having different vertical distances from the semiconductor device allows the embedded capacitors to be more easily wired in parallel, which allows for an overall higher capacitance that can be used as charge providers for the I/O switching circuits of high power semiconductor devices.

Using different sizes of embedded, singulated capacitors gives different values for the self resonant frequency of each embedded capacitor. Combining the three variables for each embedded, singulated capacitor-size, horizontal location and vertical location within the PWB semiconductor package-gives the ability to fine tune capacitor resonant frequency while providing greater capacitance for lower impedance and ultimately gives considerable design flexibility.

The Vcc (power) terminals and the Vss (ground) terminals of the semiconductor, such as a microprocessor, are connected to the first and second electrodes of the singulated embedded capacitors of the PWB semiconductor package. In turn, these capacitor electrodes may also be connected to the power and ground planes in a printed wiring motherboard.

The PWB semiconductor package design described herein allows for innerlayer panels containing singulated capacitors on foils to be formed with various materials and processes. In general, fired-on-foil techniques may preferably be employed to make singulated ceramic capacitors on foil using ceramic compositions that are fired at relatively high temperatures to form a sintered ceramic capacitor. Such capacitors may be formed from thin-film or thick-film approaches and generally have high dielectric constants. The foils containing said fired-on-foil capacitors may be laminated to prepreg using standard printed wiring board lamination processes to form inner layer panels which in turn are laminated together to form a PWB power core. After forming a PWB power core, build-up layers may be sequentially added to finish the PWB semiconductor package. Capacitors may also be integrated into the build-up layers of the PWB semiconductor package.

The methods and designs described herein for embedding capacitors into a PWB semiconductor package can result in higher capacitance and targeted resonant frequencies. These targeted resonant frequencies can be pre-determined so as to target or guide the placement design of the embedded capacitors. This placement design can achieve a range of resonant frequency values of all the capacitors. These values, when combined together with the placement design, reduce impedance over a broad range in the mid-frequency regime, such as 100 MHz to 1 to 3 GHz. Thus, the methods and designs described herein make possible the elimination of impedance spikes that surface mount or on-chip capacitance cannot address and thus operation of high power ICs at lower voltages with reduced voltage droop and voltage ripple is possible.

Figure 5D:
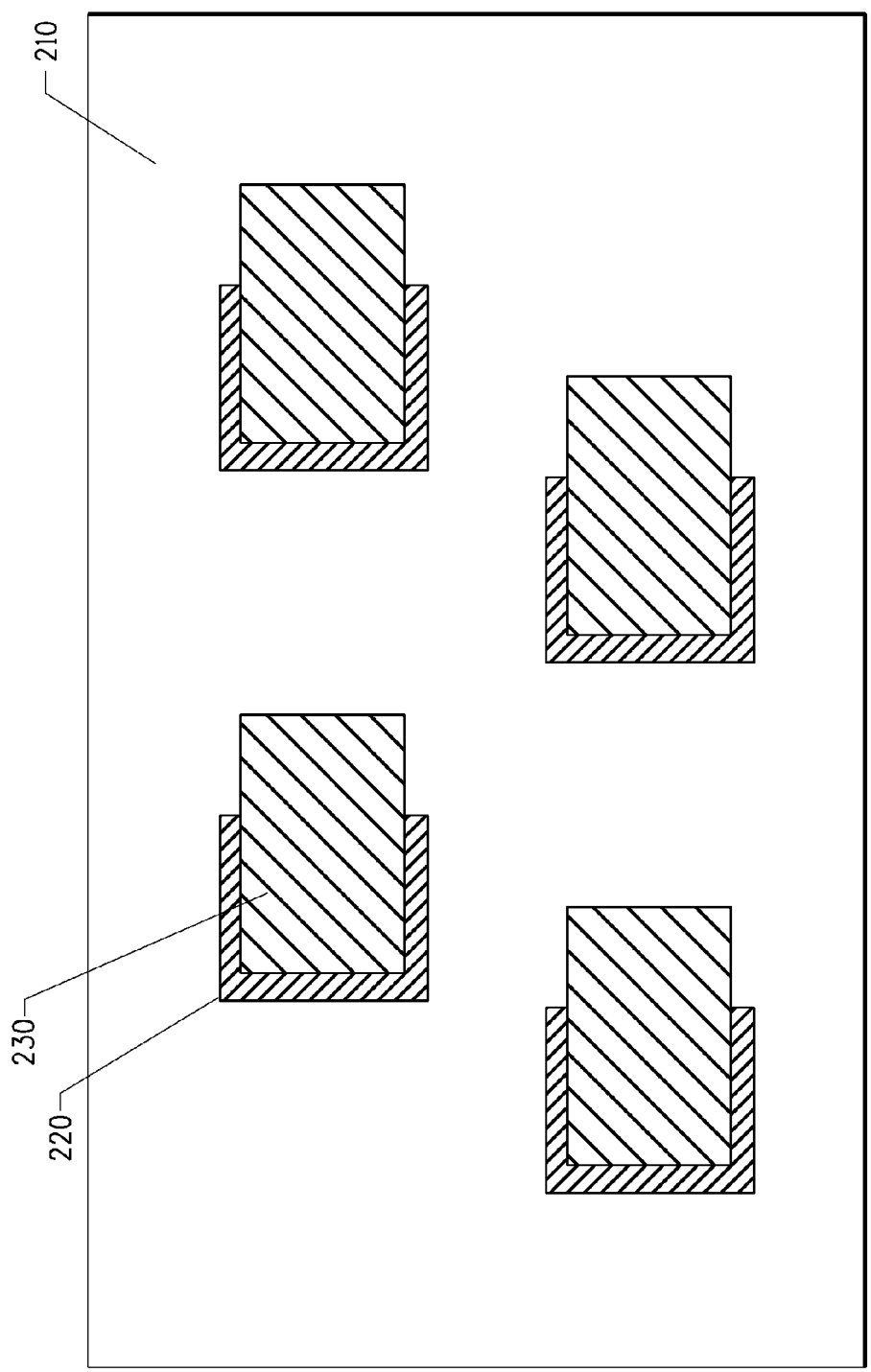
Figure 5G:
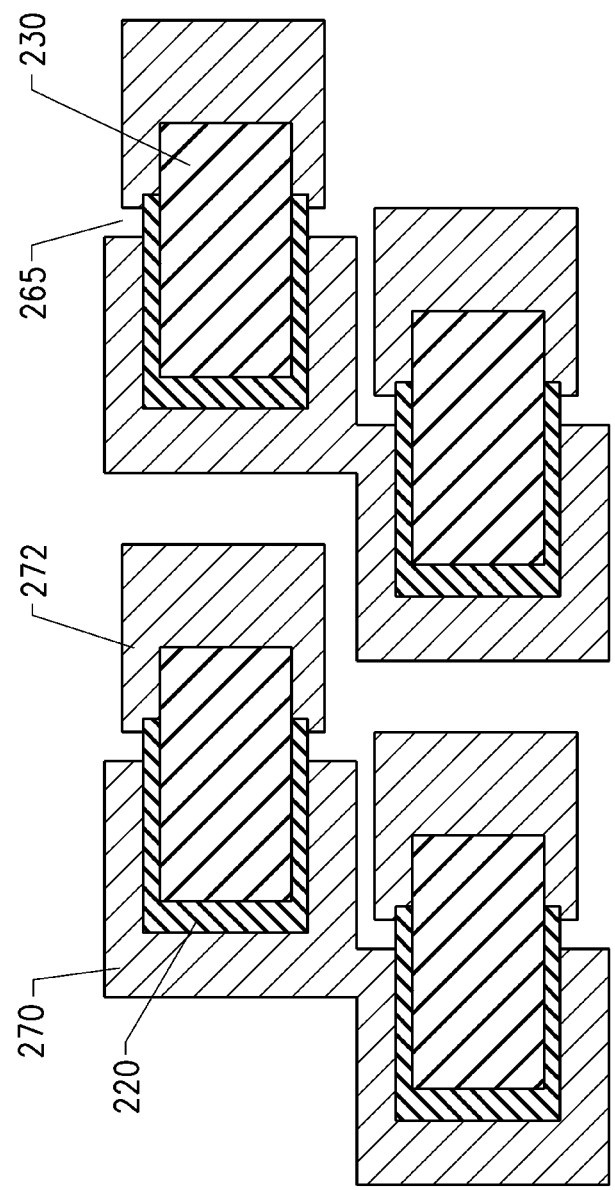

FIGS. 5A-5H illustrate a method of manufacturing a PWB semiconductor package wherein fired-on-foil singulated capacitors are embedded on multiple layers and have been interconnected by through-hole vias and microvias to conductive pads on the bottom and top surface of the PWB semiconductor package. FIG. 5D is a plan view of fired-on-foil capacitors. FIG. 5G is a plan view of the singulated capacitors after etching of the foil viewed from beneath and within the PWB inner layer panel.

Alternative approaches of forming the singulated capacitors are known and practicable and could be used in the methods described herein. For example, the dielectric may be deposited over the entirety of the metallic foil. Such an approach would require different etch patterning to connect the appropriate electrodes with the power and ground terminals of the semiconductor device but such alternative methods may achieve the same design requirements.

A specific example of fired-on-foil capacitors is described below to illustrate one way to practice the present invention. FIG. 5A is a side elevational view of a first stage of manufacturing singulated capacitors and shows metal foil 210 of a type generally available in the industry and may be copper, copper-invar-copper, invar, nickel, nickel-coated copper, or other metals that have melting points in excess of the firing temperature of the dielectric layer. Preferred foils comprise essentially copper or nickel. The thickness of foil 210 may be between 1 and 100 microns, preferably 3 to 75 microns, and most preferably 12 to 36 microns, corresponding to between about ⅓ oz and 1 oz copper foil. An example of a suitable copper foil is PLSP grade 1 ounce (36 micron thick) copper foil obtainable from Oak-Mitsui. An example of a suitable nickel foil is 25 micron Nickel Foil 201 obtainable from Allfoils.

In FIG. 5B, a capacitor dielectric material is deposited onto foil 210, forming dielectric layer 220. The capacitor dielectric material may be deposited, for example, by screen printing a high dielectric constant dielectric paste or sputtering a high dielectric constant material through a mask to define the dielectric area. Other deposition methods include coating the desired areas of the foil using a chemical solution of a high dielectric constant material. Other methods may be appropriate.

High dielectric constant (high K) materials refer to materials that have bulk dielectric constant above 500 and can comprise perovskite-type ferroelectric compositions with the general formula $ABO_3$. Examples of such compositions include, but not limited to $BaTiO_3$; $SrTiO_3$; $PbTiO_3$; $PbTiZrO_3$; $BaZrO_3$ and $SrZrO_3$ or mixtures thereof. Other compositions are also possible by the substitution of alternative elements into the A and/or B position, such as $Pb(Mg_{1/3}Nb_{2/3})O_3$ and $Pb(Zn_{1/3}Nb_{2/3})O_3$. A suitable K material is barium titanate ($BaTiO_3$).

Doped and mixed metal versions of the above compositions are also suitable dielectric materials. Doping and mixing is done primarily to achieve the necessary end-use property specifications such as, for example, the necessary temperature coefficient of capacitance (TCC) in order for the material to meet Electrical Industry Association specifications, such as "X7R" or "Z5U" standards.

Dielectric layer 220 is then fired. The firing temperature may be in the range of 700° C. to 1400° C. The firing temperature depends on the melting point of the underlying metallic foil and the microstructural development desired in the dielectric. For example, a suitable maximum firing temperature for copper is approximately 1050° C. but for nickel, it can be as high as 1400° C. due to their melting points. During firing, the dielectric crystallizes and densities. Crystallization typically occurs in the temperature range of 500-700° C. and further heating densifies the dielectric and promotes grain growth. Firing is done under a protective or reducing atmosphere sufficiently low in oxygen to afford oxidation protection to the metal foil. The exact atmosphere required will depend upon the temperature and the thermodynamics and kinetics of oxidation of the underlying metallic foil. Such protective atmospheres can be thermodynamically derived from standard free energy of formation of oxides as a function of temperature calculations or diagrams as disclosed in publication " F. D. Richardson and J. H. E. Jeffes, J. Iron Steel Inst., 160, 261 (1948). For example, using copper as the underlying metallic foil, firing at 700° C., 900° C. and 1050° C. would require partial pressures of oxygen ($PO_2$) of approximately less than $4 \times 10^{-11}$, $3.7 \times 10^{-8}$, and $1.6 \times 10^{-6}$ atmospheres respectively to protect the copper from oxidation.

In FIG. 5C, electrode 230 is formed over dielectric layer 220. Electrode 230 can be formed by, for example, screen printing a conductive paste or sputtering as well as other methods known in the art. In general, the surface area of the dielectric layer 220 should be larger than that of the electrode 230. Although electrode 230 is typically deposited after dielectric layer 220 has been fired, it may also may be deposited prior to firing dielectric layer 220, in which case the top electrode and the dielectric are fired together.

FIG. 5D is a top plan view of the article of FIG. 5C. FIG. 5D shows four dielectric layers 220 and four electrodes 230 on foil 210. However, any number of dielectric layers 220 and electrodes 230, in various patterns or positions consistent with the power and ground terminals of the semiconductor device can be arranged on foil 210.

FIG. 5E shows an inverted capacitor-on-foil structure in which the component side of the structure (that is, the side containing dielectric layers 220 and electrode layers 230) is laminated to a PWB core comprising prepreg 360 and metal foil 310. Lamination can be performed, for example, using FR4 epoxy prepreg in standard printing wiring board processes. Alternatively, epoxy prepreg Type 106 may be used. Suitable lamination conditions may be 185° C. at 208 psig for 1 hour in a vacuum chamber evacuated to 28 inches of mercury. A silicone rubber press pad and a smooth PTFE (polytetrafluoroethylene) filled glass release sheet may be in contact with foils 210 and 310 to prevent the epoxy from gluing the lamination plates together. The dielectric prepreg and laminate materials can be any type of dielectric material such as, for example, standard epoxy, high Tg epoxy, polyimide, polytetrafluoroethylene, cyanate ester resins, filled resin systems, BT epoxy, and other resins and laminates that provide electrical insulation. A release sheet may be in contact with the foils to prevent the epoxy from gluing the lamination plates together between circuit layers. The resulting structure is encapsulated by foil 210 on one side and foil 310 on the other.

Referring to FIG. 5F, after lamination, a photo-resist (not shown) is applied to foils 210 and 310. The photo-resist is imaged, developed and the metal foils are patterned by etching and the photo-resist is stripped using standard printing wiring board processing conditions. The etching produces a trench 265 in foil 210, creating two surface electrodes 270 and 272 from foil 210. Electrode 272 and electrode 230 are connected and forms the opposite electrode to electrode 270. Foil 310 may either be entirely removed in the etching process as shown in FIG. 5F or patterned to have some features.

FIG. 5G is a plan view from below of the singulated capacitors after patterning the foil. The view is taken at the position of the arrows in FIG. 5F and therefore does not include prepreg 360.

Figure 5H:
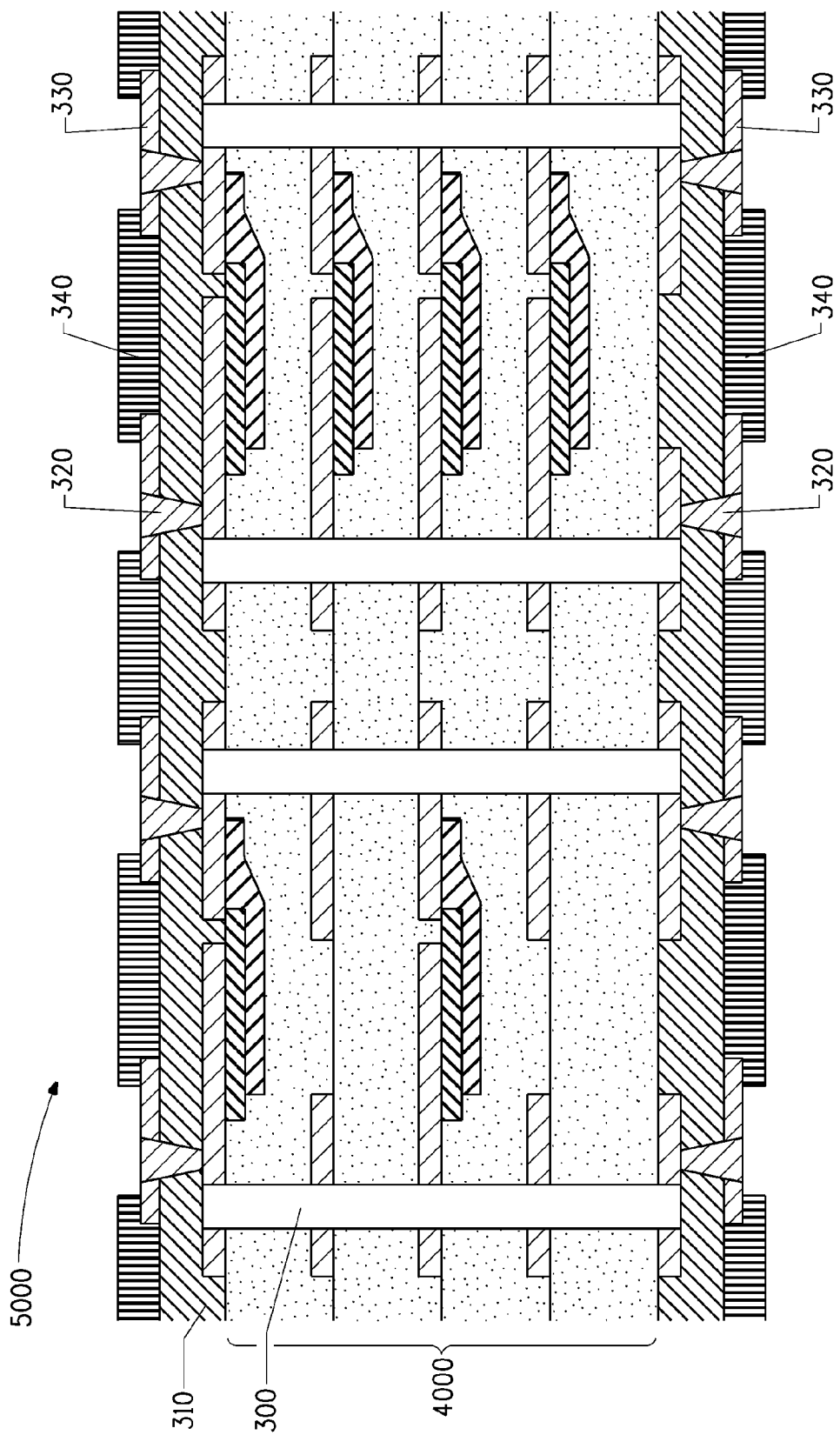

Referring to FIG. 5H, after patterning of the foil, the desired number of inner layer panels, each with the desired number and sizes of singulated capacitors, may be laminated together using standard PWB lamination conditions to form PWB power core structure 4000 containing singulated capacitors on multiple layers. Each laminated inner layer panel may be uniquely patterned. Through-hole vias 300 connecting the capacitors as well as any signal vias may be drilled and plated at this stage. A desired number of build up layers 310 may be added as well as any signal layers, additional layers and circuitry. Connections from the power core to the surface of the PWB semiconductor package may be made by micro-vias 320 and surface pads 330. Finally a solder mask 340 may be added to complete the PWB semiconductor package 5000 of FIG. 5H.

Figure 6:
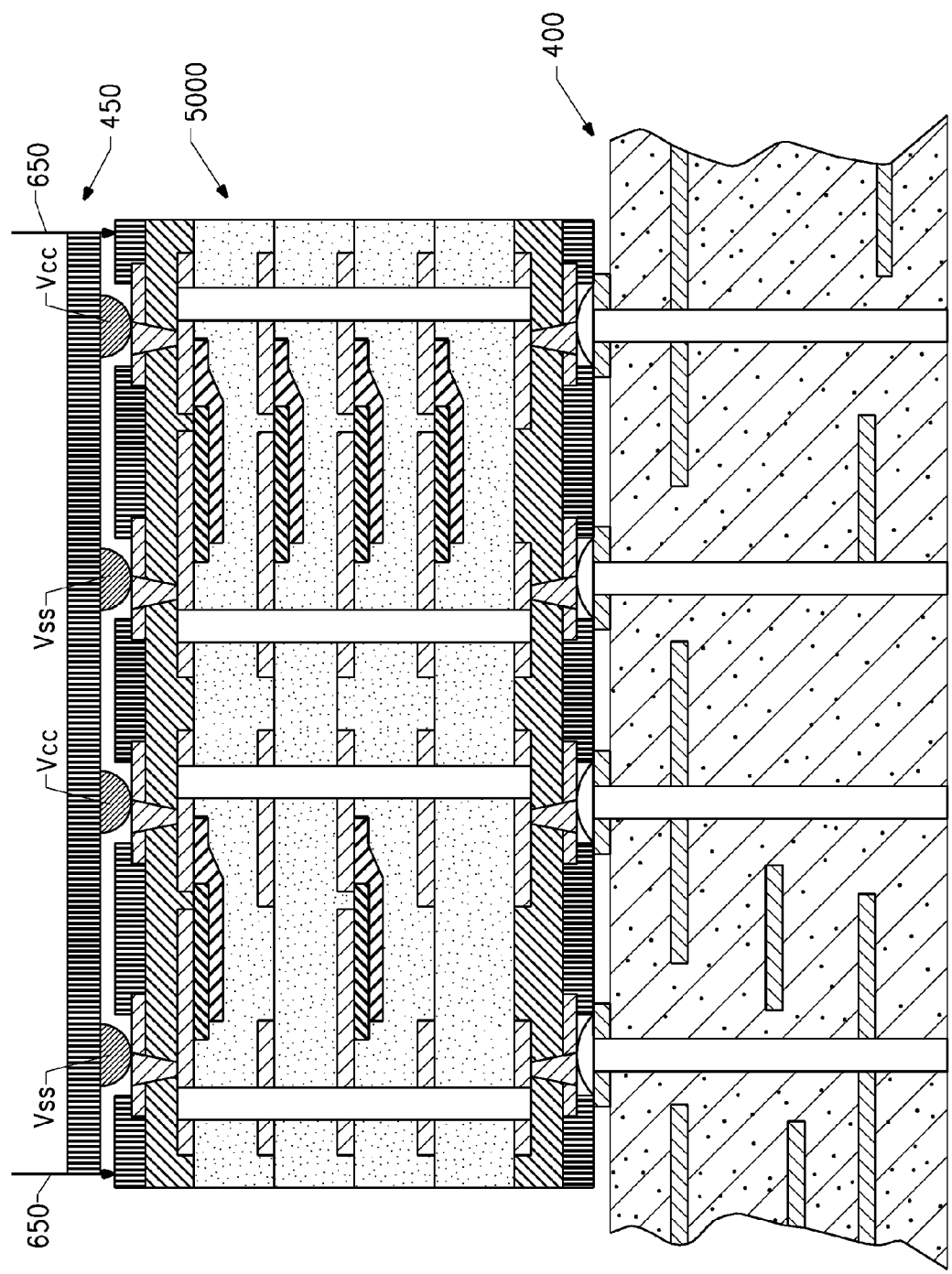
FIG. 6 is a representation in section view of the PWB semiconductor package depicted in FIG. 5H interconnected with a attached semiconductor, such as a microprocessor, and a printed wiring motherboard.

The PWB semiconductor package 5000 illustrated in FIG. 6 is shown as having approximately the same area as the semiconductor. However, it may be equal to or much bigger in area than the semiconductor and may have any number of capacitors of various sizes on each inner layer that contains capacitors, at least a part of each embedded capacitor lying within the die shadow. The PWB semiconductor package 5000 may also contain inner layers without capacitors and may be formed by different sequences of manufacturing steps than described hereinabove.

FIG. 6 is a sectional section view of PWB semiconductor package 5000 interconnected to mother board 400 and a semiconductor device 450, such as a microprocessor. As shown, semiconductor device 450 has two power and two ground terminals but may have many more. The power (Vcc) and ground (Vss) terminals of the semiconductor device 450 are connected to the respective power and ground electrodes of the embedded capacitors which are in turn connected to the appropriate circuitry in the PWB mother board.

As shown in FIG. 6, the die shadow is the area of semiconductor device 450 that is projected onto the top surface of the PWB semiconductor package and extends between arrows 650. Also as shown, one power and ground terminal of the semiconductor is connected to two capacitors in parallel whereas another power and ground terminal is connected to four capacitors in parallel. However, it should be understood that any number or size of the capacitors that lie at least partly within the die shadow may be connected to each power and ground terminal of the semiconductor.

EXAMPLE 1

Figure 7:
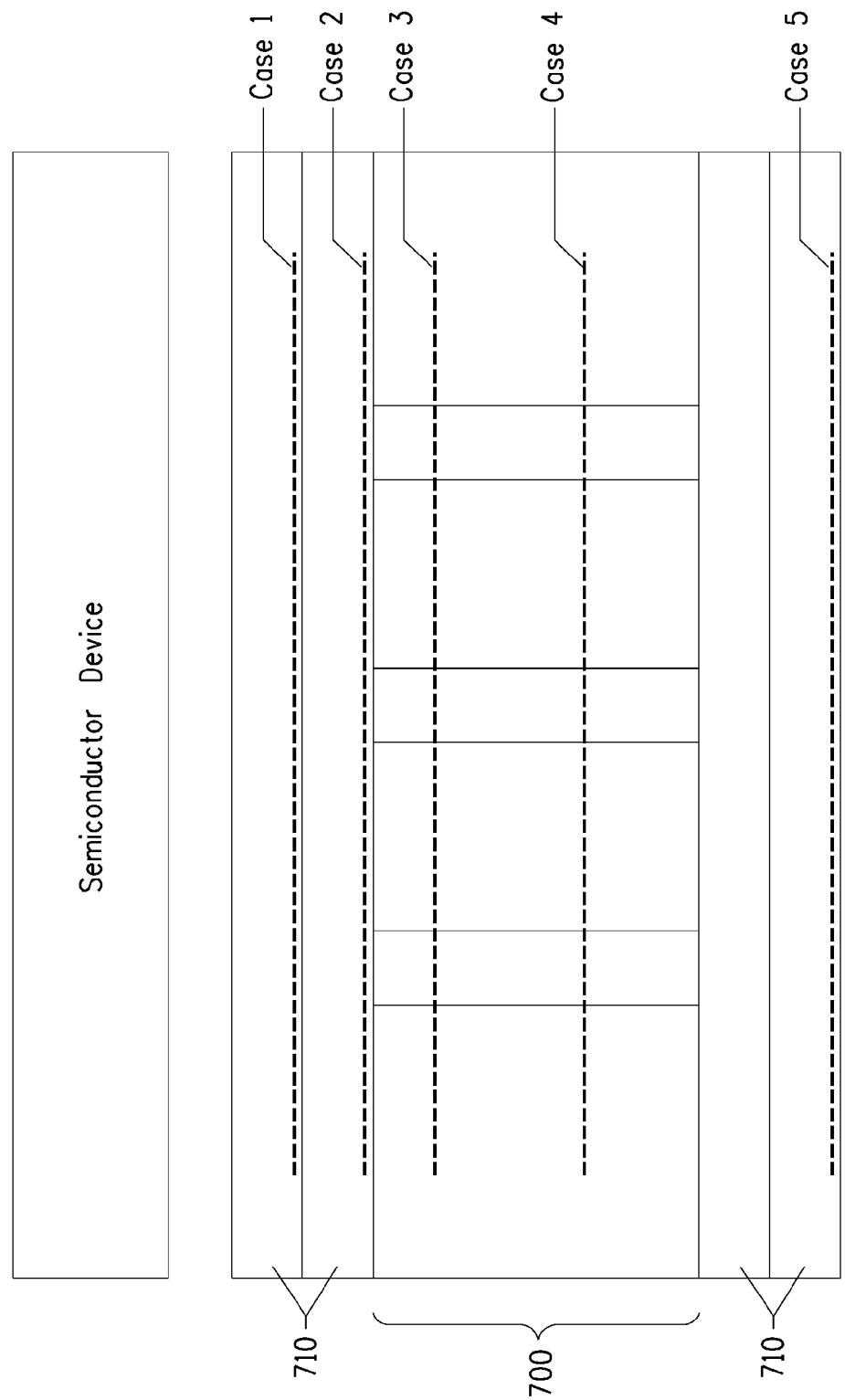
FIG. 7 depicts in section view five capacitor locations incorporated into a core and build-up layers of a PWB semiconductor package by methods described herein.

Table 1 shows observed inductance data for vias, as a function of the via length (in microns) for five capacitors placed in different locations in PWB semiconductor package of FIG. 7. The capacitors were of the same type, size, capacitance value, and termination separation to remove these variables from influencing the results. Via length is the connection distance between capacitor terminals and the IC terminals and is measured in microns. Total via inductance is measured in picoHenries [pH]. The inductance data was obtained from circuit measurements on test vehicles having 2 mm square capacitors placed in the five different locations in the PWB.

TABLE 1

Measured Via Inductance as a Function of Via Length

| CASE NO. | VIA LENGTH - μm | TOTAL VIA INDUCTANCE - pH |
|---|---|---|
| 1 | 38 | 6 |
| 2 | 76 | 19.74 |
| 3 | 171 | 70.6 |
| 4 | 376 | 123.56 |
| 5 | 752 | 319.48 |

The PWB semiconductor package outlined in FIG. 7 has 4 layer PWB core 700 with 2 build up layers 710 applied to each side, commonly referred to as a 2/4/2 configuration. The PWB semiconductor package is shown as incomplete (without microvias, bumps, etc.) to clearly illustrate the position of the capacitors. The positions of each of the five capacitors are designated Case 1 to 5. In Case 1, the capacitor is placed between the top two build-up layers, closest to the semiconductor device; in Case 2 the capacitor is placed on the top of the core laminate; in Case 3 the capacitor is placed 100 um inside the core BT laminate; in Case 4 the capacitor is placed in the middle of the core laminate; and in Case 5 the capacitor is placed at the bottom of the structure on the bottom build-up layer. In all cases, the diameter of the microvias was 100 μm and the spacing between them was 300 μm.

Using these inductance values and lengths, simulations were performed to show the relationship between the impedance reduction and capacitor distance from the die. The simulations were based on four, 2 mm square capacitors placed within the die shadow for the five cases. The capacitor properties used for the simulations were: capacitance equal to 5.31 pF (picoFarad), Equivalent Series Resistance equal to 8.59 milliOhms and Equivalent Series Inductance of the capacitor equal to 27.11 pH (picoHenries).

Figure 8:
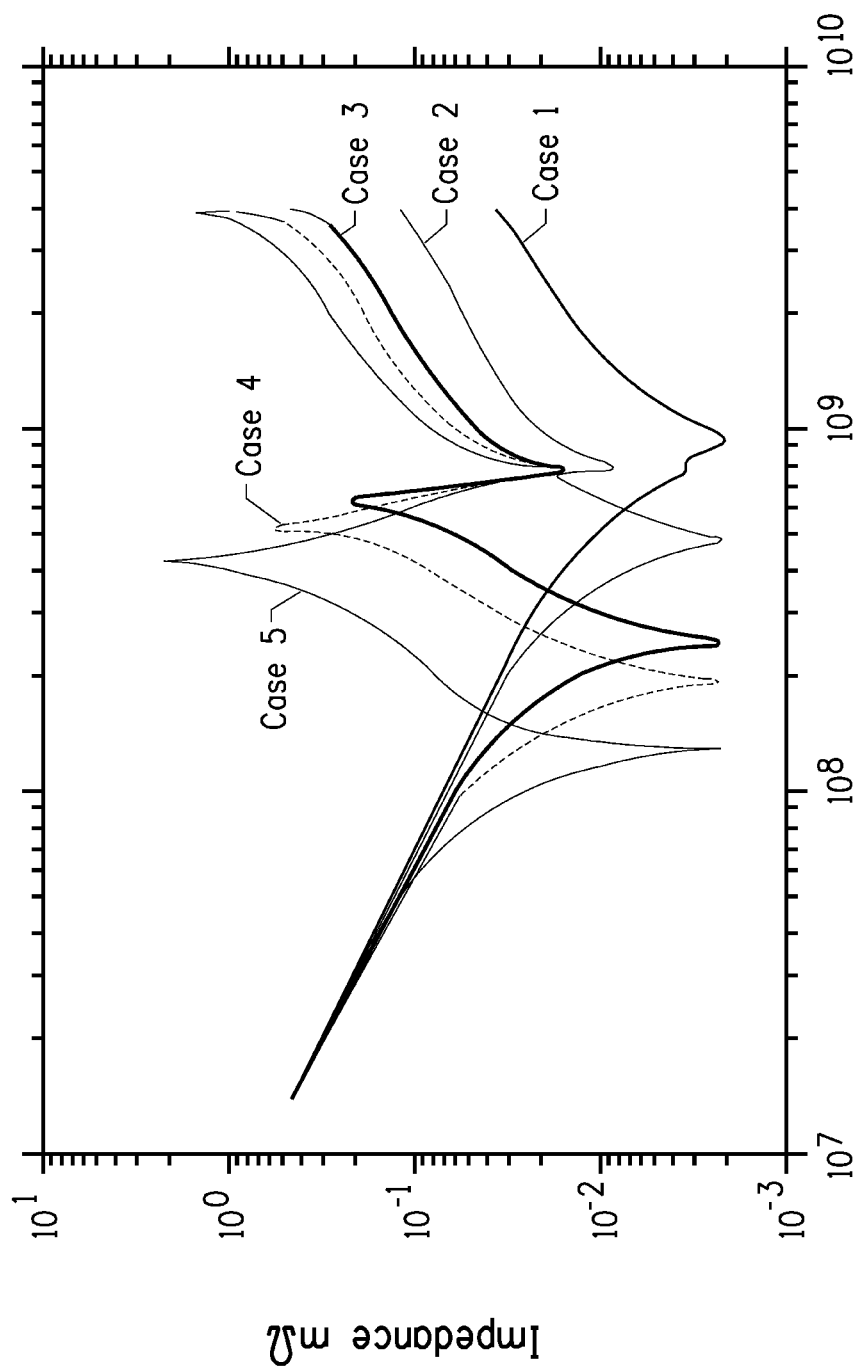
FIG. 8 shows the electrical simulation results for impedance versus frequency response for the five capacitor locations shown in FIG. 7.

FIG. 8 plots the impedance of the package versus frequency data for these simulations of the various embedded capacitors. The plots show the resonant frequencies of the capacitors resulting from the different embedded capacitor placements. As can be seen, the resonant frequency of each embedded capacitor is dependent on its vertical location in the PWB semiconductor package. The higher resonant frequencies result from lower circuit inductance due to placement closer to the IC and within the die shadow.

Figure 9:
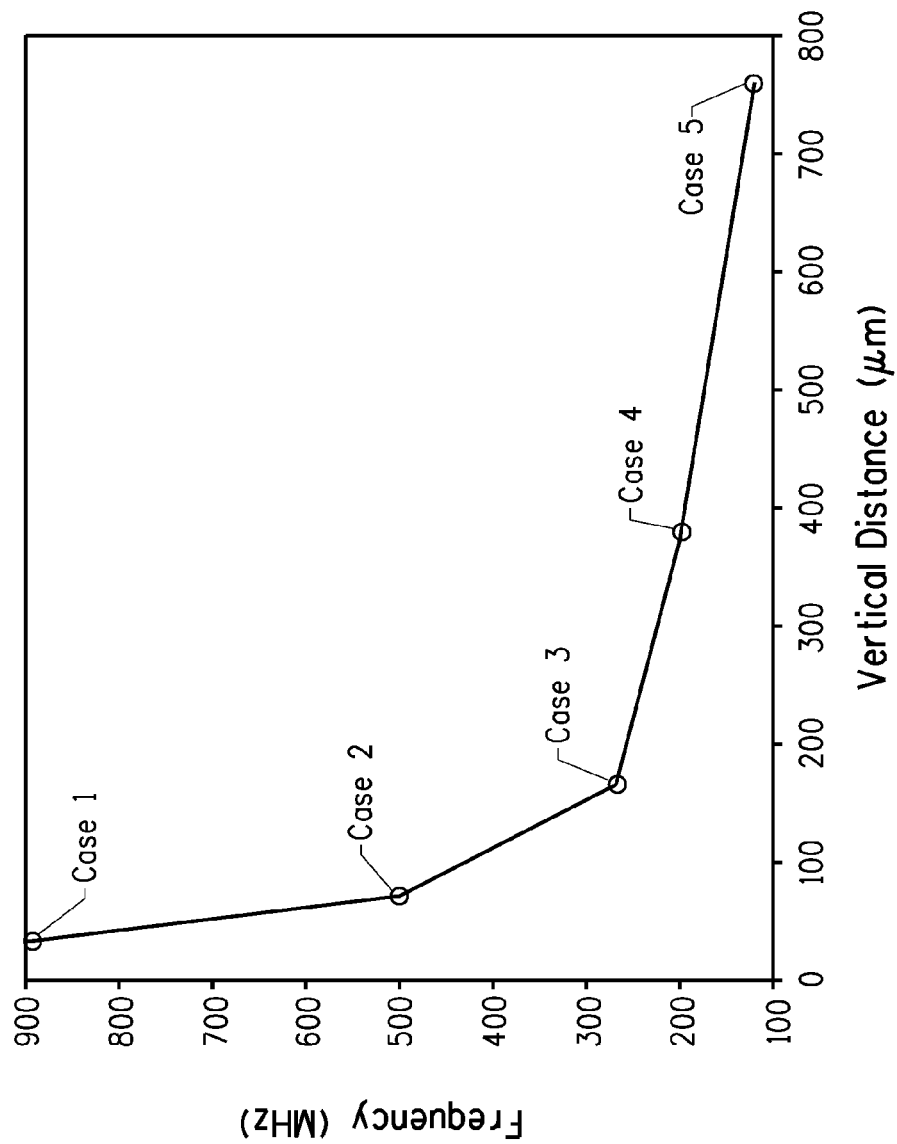
FIG. 9 plots capacitor resonant frequency versus distance from the semiconductor device for the five capacitor locations shown in FIG. 7.

FIG. 9 is a plot of the resonant frequency in MHz for each case versus the distance from Integrated Circuit, which depicts a range of resonant frequencies obtainable from placement of the capacitors in the various locations of the PWB semiconductor package.

Figure 4A:
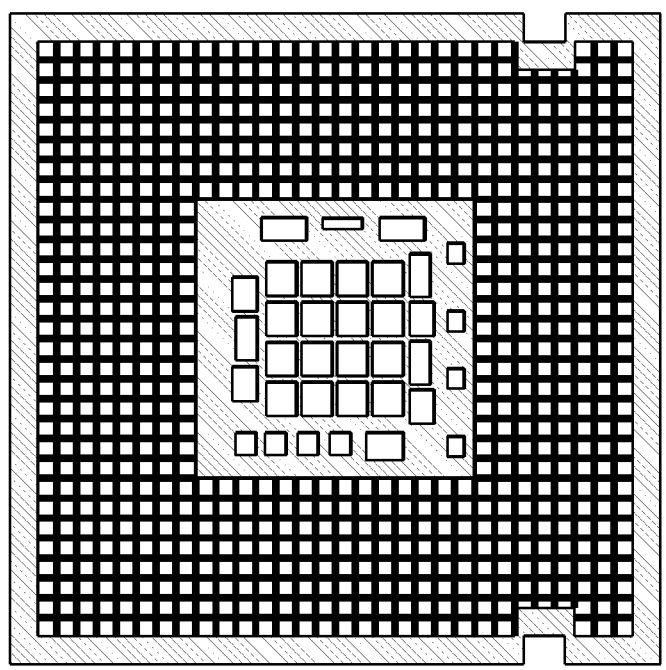
FIG. 4 is adapted from Intel Technology Journal, Volume 9, Issue 4, 2005 and shows a graph in the prior art of the normalized impedance versus frequency resulting from placing SMT capacitors on the backside of a Pentium® 4 printed wiring board semiconductor package.
Figure 4B:
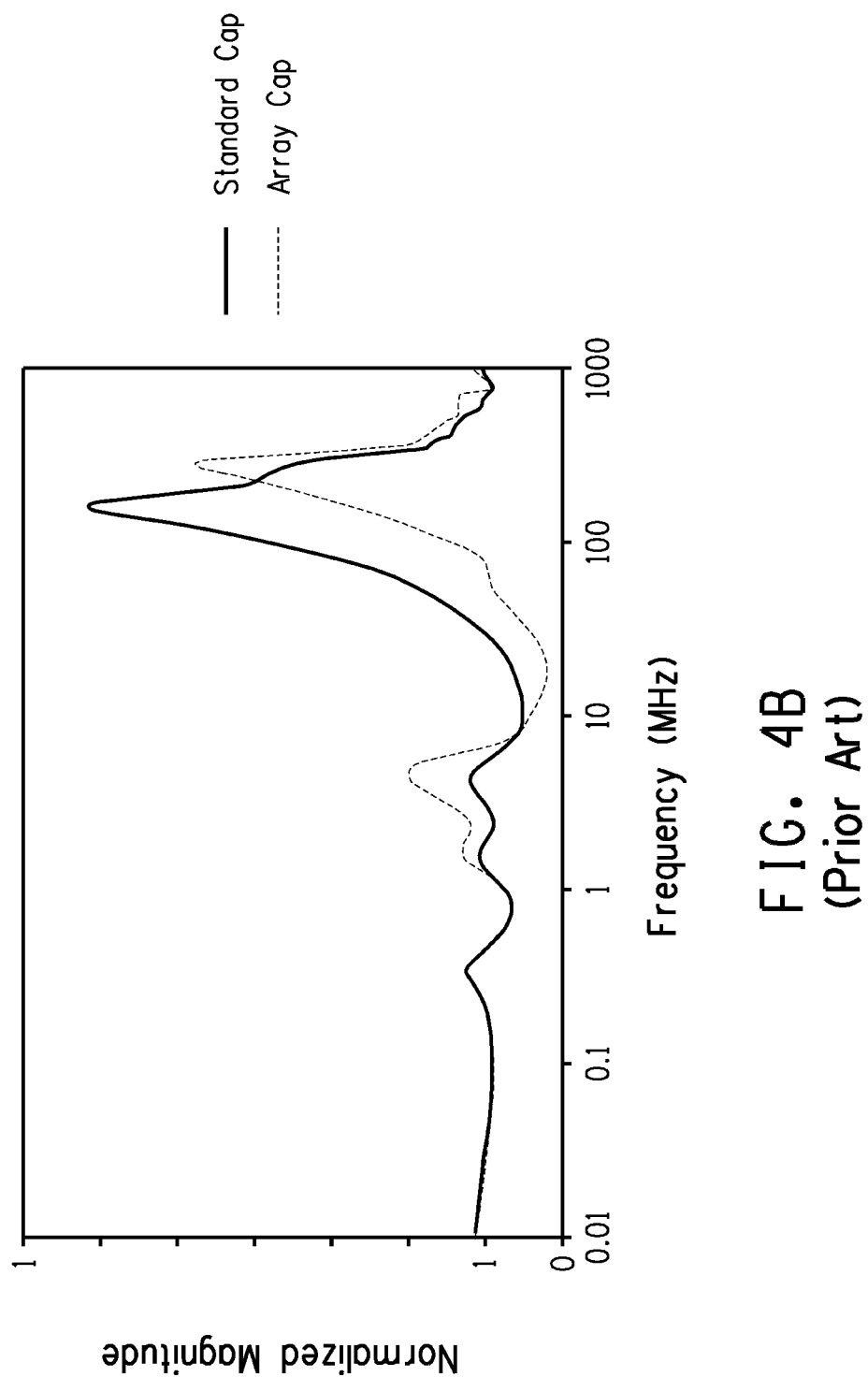

This example illustrates that placement of a capacitor on different layers of a PWB semiconductor package changes the resonant frequency of the capacitor. By suitable vertical positioning of a capacitor, its resonant frequency can be tailored to a desired value. By placing multiple capacitors on multiple layers, the impedance over the frequency range (100 MHz to 1 GHz) that shows an impedance peak in prior art FIG. 4 can be reduced. Placing capacitors on multiple layers within the die shadow allows for a three dimensional approach to solve the issue of mid-frequency decoupling rather than an array method. The three dimensional approach allows fine tuning of the capacitor resonant frequencies and for much higher capacitance to be contained within the die shadow, thereby making it easier to supply adequate power to high power semiconductor devices.

EXAMPLE 2

Inner layer test panels as shown in FIG. 5F were made according to the methods described herein with capacitors of various sizes. Both electrodes of the capacitor were on the outer layer of the inner layer test panel. No vias were included in this example in order to focus purely on the effects of capacitor size. The capacitors were evaluated and then simulations were performed to determine their size effects on impedance. Capacitor sizes were 1.198 mm by 1.198 mm, 2 mm by 2 mm, 5 mm by 5 mm, and 10 mm by 10 mm. Capacitance of the capacitors were 2.84 nF, 8.772 nF, 53.93 nF and 191 nF respectively.

Figure 10:
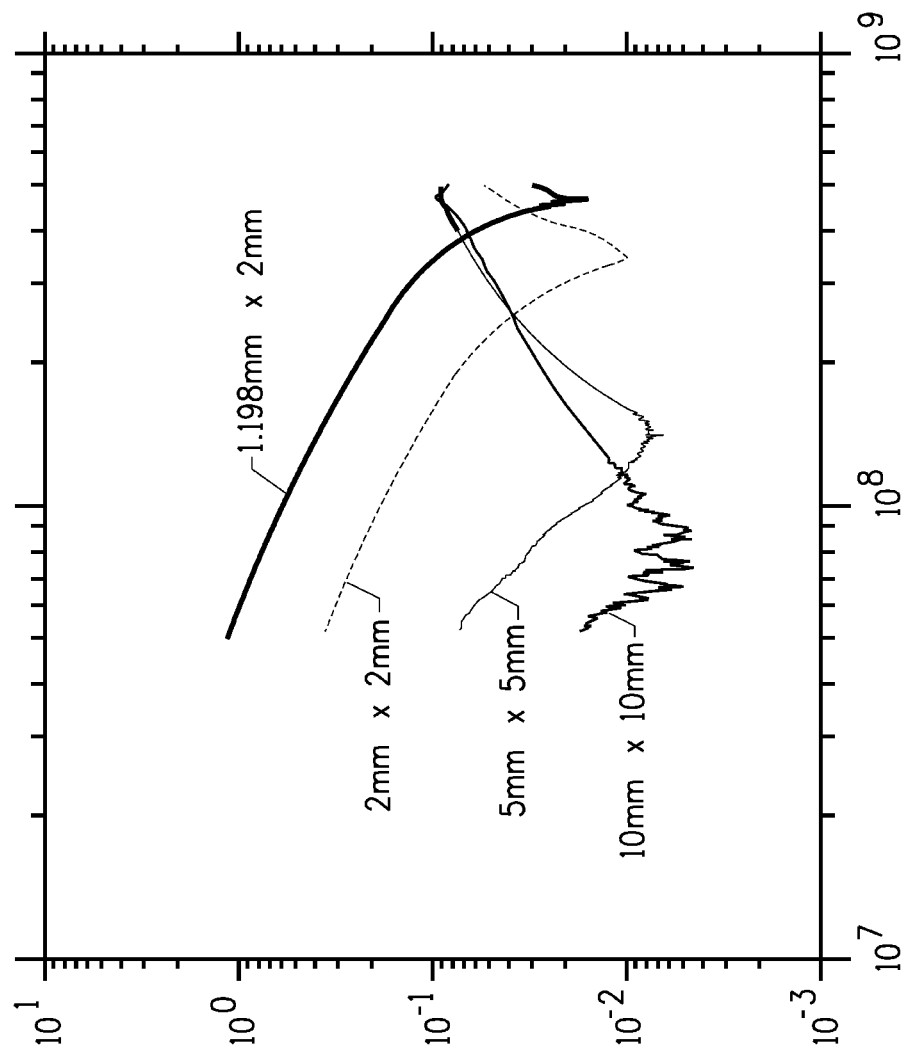
FIG. 10 shows the impedance versus frequency for four different sized capacitors placed in the outer layer of the test package.

FIG. 10 is a graph of impedance of the capacitors versus frequency and shows that the resonant frequency of the capacitor increases as the size of the capacitor reduces. The larger capacitors had lower impedance than the smaller capacitors due to their higher capacitance. The frequency range covered by the various sizes was approximately the same range that had an impedance spike in prior art FIG. 4.

The above example illustrates that placement of capacitors of different sizes on a layer of the PWB semiconductor package allows for tailoring of the resonant frequency to a desired value.

Embedding different sized capacitors in a PWB semiconductor using the following principles:
  a) at least a part of each embedded capacitor lies within the die shadow;
  b) each embedded capacitor may lie on a different layer of the package than any other embedded capacitor; and
  c) each embedded capacitor is vertically placed such that the embedded capacitor terminals are within a distance from the semiconductor less than the thickness of the package yields the following previously unpredictable result:
1) It allows for increased flexibility in the design of PWB semiconductor package; and
2) It provides a method for reducing the impedance of the PWB semiconductor package at a targeted frequency range, especially between 100 MHz and 1 to 3 GHz.

What is claimed is:

1. A method of making a printed wiring board semiconductor package, the method comprising,
  providing a first inner layer panel including a first inner layer panel capacitor;
  providing a second inner layer panel including a second inner layer panel capacitor, wherein the first inner layer panel capacitor comprises an area that differs from that of the second inner layer panel capacitor;
  laminating the first and second inner layer panels together in overlying succession such that the first and second inner layer capacitors are at differing vertical positions within the printed wiring board semiconductor package, wherein the first inner layer panel is stacked on and adjacent to the second inner layer panel;
  providing a semiconductor that projects a die shadow onto the printed wiring board semiconductor package, wherein at least a part of each of the first and second inner layer panel capacitors lies within the die shadow; and
  interconnecting the first and second inner layer capacitors to a semiconductor through a conductive via.

2. The method of claim 1, wherein said interconnecting the first and second inner layer capacitors to the semiconductor comprises interconnecting the first and second inner layer capacitors using a conductive trace on a same plane.

3. The method of claim 1, wherein said interconnecting the first and second inner layer capacitors to the semiconductor comprises interconnecting the first and second inner layer capacitors using a conductive via connection selected from the group consisting of a micro via and a through via.

4. The method of claim 1, wherein the conductive via connection is achieved by mechanical means or by laser means.

5. A method of making a printed wiring board semiconductor package, the method comprising:
  creating a printed wiring board semiconductor package, wherein said creating a printed wiring board semiconductor package includes:
  providing a first inner layer panel including a first inner layer panel capacitor;
  providing a second inner layer panel including a second inner layer panel capacitor, wherein the first inner layer panel capacitor comprises an area that differs from that of the second inner layer panel capacitor;
  laminating the first and second inner layer panels together in overlying succession such that the first and second inner layer capacitors are at differing vertical positions- within the printed wiring board semiconductor package, wherein the first inner layer panel is stacked on and adjacent to the second inner layer panel; and
  interconnecting the first and second inner layer capacitors to a semiconductor through a conductive via; and
  attaching to the printed wiring board semiconductor package a semiconductor which projects a die shadow onto the printed wiring board semiconductor package.

6. The method of claim 5, wherein the interconnecting the first and second inner layer capacitors to the semiconductor through a conductive via comprises interconnecting the first and second inner layer capacitors to the semiconductor through a conductive via connection selected from the group consisting of a micro via and a through via.

7. The method of claim 5, further comprising interconnecting the first and second inner layer capacitors to each other through a conductive trace in the same plane or through a conductive via connection selected from the group consisting of a micro via and a through via.

8. The method of claim 6, wherein the conductive via connection is achieved by mechanical means or by laser means.

9. A printed wiring board semiconductor package comprising:
  a first inner layer panel including a first inner layer panel capacitor; and
  a second inner layer panel including a second inner layer panel capacitor, wherein the first inner layer panel is stacked on and adjacent to the second inner layer panel; and wherein the first and second inner layer panels are laminated together in overlying succession such that the first and second inner layer panel capacitors are at differing vertical positions within the printed wiring board semiconductor package;
  a semiconductor that projects a die shadow onto the printed wiring board semiconductor package, wherein at least a part of each of the first and second inner layer panel capacitors lies within the die shadow; and
  a conductive via interconnecting the first and second inner layer capacitors to the semiconductor.

10. The printed wiring board semiconductor package of claim 9, wherein the first and second inner layer panel capacitors are selected from the group consisting of ceramic capacitors, thick film capacitors, thin film capacitors, capacitors comprising a material having a high dielectric constant, and combinations of these.

11. The printed wiring board semiconductor package of claim 9, wherein the printed wiring board semiconductor package possesses reduced impedance in a range of targeted frequency between about $5 \times 10^7$ Hertz and about $3 \times 10^9$ Hertz.

12. The printed wiring board semiconductor package of claim 9, wherein the first and second inner layer panel capacitors each comprise a singulated, fired-on-foil capacitor.

13. The printed wiring board semiconductor package of claim 12, wherein the first and second inner layer panel capacitors are located in adjacent inner layer panels such that no other capacitors are located between the first and second inner layer panel capacitors.

14. A device for reducing impedance at a targeted frequency, the device comprising:
  a printed wiring board semiconductor package;
  a semiconductor attached thereto and projecting a die shadow onto the printed wiring board semiconductor package,
  wherein the printed wiring board package includes a first inner layer panel stacked on and adjacent to a second inner layer panel, wherein the first inner layer panel comprises a first inner layer panel capacitor, wherein the second inner layer panel comprises a second inner layer panel capacitor, and wherein the first inner layer panel capacitor includes an area differing from that of the second inner layer panel capacitor;
  wherein the first and second inner layer panels are laminated together in overlying succession such that the first inner layer panel capacitor is at a differing vertical distance from the semiconductor than the second inner layer panel capacitor; and
  wherein at least a part of each of the first and second inner layer panel capacitors lies within the die shadow; and
  a conductive via interconnecting the first and second inner layer capacitors to the semiconductor.

15. The device of claim 14, wherein the first and second inner layer panel capacitors are selected from the group consisting of ceramic capacitors, thick film capacitors, thin film capacitors, capacitors comprising a material having a high dielectric constant, and combinations of these.

16. The device of claim 14, wherein the printed wiring board semiconductor package possesses reduced impedance in a range of targeted frequency between about $5 \times 10^7$ Hertz and about $3 \times 10^9$ Hertz.

17. The device of claim 14, wherein the first and second inner layer panel capacitors each comprise a singulated, fired-on-foil capacitor.

18. The device of claim 17, wherein the first and second inner layer panel capacitors are located in adjacent inner layer panels such that no other capacitors are located between the first and second inner layer panel capacitors.

* * * * *

UNITED STATES PATENT AND TRADEMARK OFFICE
CERTIFICATE OF CORRECTION

PATENT NO. : 8,564,967 B2
APPLICATION NO. : 11/949329
DATED : October 22, 2013
INVENTOR(S) : Amey, Jr. et al.

It is certified that error appears in the above-identified patent and that said Letters Patent is hereby corrected as shown below:

In the Specification

In Column 5, Line 15, delete "with a" and insert -- with an --, therefor.

In Column 8, Line 62, delete "suitable" and insert -- suitable high --, therefor.

In Column 9, Line 11, delete "densities." and insert -- densifies. --, therefor.

In the Claims

In Column 12, Line 46, in Claim 1, delete "comprising," and insert -- comprising: --, therefor.

Signed and Sealed this
Thirteenth Day of May, 2014

Michelle K. Lee
*Deputy Director of the United States Patent and Trademark Office*